United States Patent
Yamada et al.

(10) Patent No.: US 6,365,460 B1
(45) Date of Patent: Apr. 2, 2002

(54) PRODUCTION OF SILICON CARBIDE BODIES

(75) Inventors: Hirotake Yamada, Anjo; Makoto Murai, Nagoya; Hiroshi Furukubo, Ichinomiya, all of (JP); Yasufumi Aihara, California, CA (US); Tsuneaki Ohashi, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/460,018

(22) Filed: Dec. 13, 1999

(30) Foreign Application Priority Data

Dec. 16, 1998 (JP) .............................. 10-357933

(51) Int. Cl.$^7$ ........................ H01L 21/00; H01L 21/369
(52) U.S. Cl. ........................ 438/268; 438/272; 438/586
(58) Field of Search ................................ 438/268, 272, 438/586

(56) References Cited

U.S. PATENT DOCUMENTS 5,279,780 A * 1/1994 Lipowitz .................. 264/29.2
5,366,943 A * 11/1994 Lipowitz et al. .............. 501/95

FOREIGN PATENT DOCUMENTS

| JP | 1-224286 | 9/1989 |
| JP | 10-256108 | 9/1998 |
| JP | 11121311 A * | 4/1999 |

OTHER PUBLICATIONS

U.S. application No. 09/609,539, Nishioka et al., filed Jun. 30, 2000.

* cited by examiner

Primary Examiner—Michael Lebentritt
(74) Attorney, Agent, or Firm—Burr & Brown

(57) ABSTRACT

A method for producing a silicon carbide body, includes the steps of forming a silicon carbide mass by chemical vapor deposition, and thermally treating the silicon carbide mass under vacuum or in an inert gas atmosphere at a temperature not less than 2000° C., the silicon carbide article having an electric resistivity higher than that of the silicon carbide mass having not been thermally treated.

19 Claims, 1 Drawing Sheet

PRODUCTION OF SILICON CARBIDE BODIES

BACKGROUND OF THE INVENTION (1) Field of the Invention

The present invention relates to a method for producing silicon carbide articles.

(2) Related Art Statement

For example, JP-A-10-256,108 and JP-A-01-224,286 describe methods for producing silicon carbide bodies on surfaces of substrates of such as graphite by chemical vapor deposition. Such silicon carbide bodies are dense and highly corrosion resistive.

The inventors have urgently needed to increase the electric resistivity of silicon carbide bodies and obtain such silicon carbide bodies having high resistivities. For, the formation of highly resistive silicon carbide bodies have been demanded in the field of the semiconductor-producing apparatuses. However, although producing conditions for carrying out the chemical vapor deposition such as a carrier gas flow rate, a silicon source gas flow rate, a carbon source gas flow rate, a film-forming temperature and a film forming time were changed in various ways, it was difficult to increase the electric resistivity of the silicon carbide bodies beyond a certain level.

SUMMARY OF THE INVENTION

It is an object of the present invention to remarkably increase the electric resistivity of the silicon carbide bodies obtained by the chemical vapor deposition.

The present inventors discovered that the electrical resistivity of the silicon carbide body can be remarkably increased by thermally treating a silicon carbide mass formed by chemical vapor deposition under vacuum or in an inert gas atmosphere at a temperature not less than 2000° C. The present inventors reached the invention based on this discovery. In the above, the term "mass" includes a film, a layer, a body, etc.

These and other objects, features and advantages of the invention will be explained in more detail with the understanding that some modifications, variations and changes could be easily made by the skilled person in the art to which the invention pertains.

BRIEF DESCRIPTION OF THE DRAWING

For a better understanding of the invention, reference is made to the attached drawing, wherein.

DETAILED DESCRIPTION OF THE INVENTION

Figure 1:
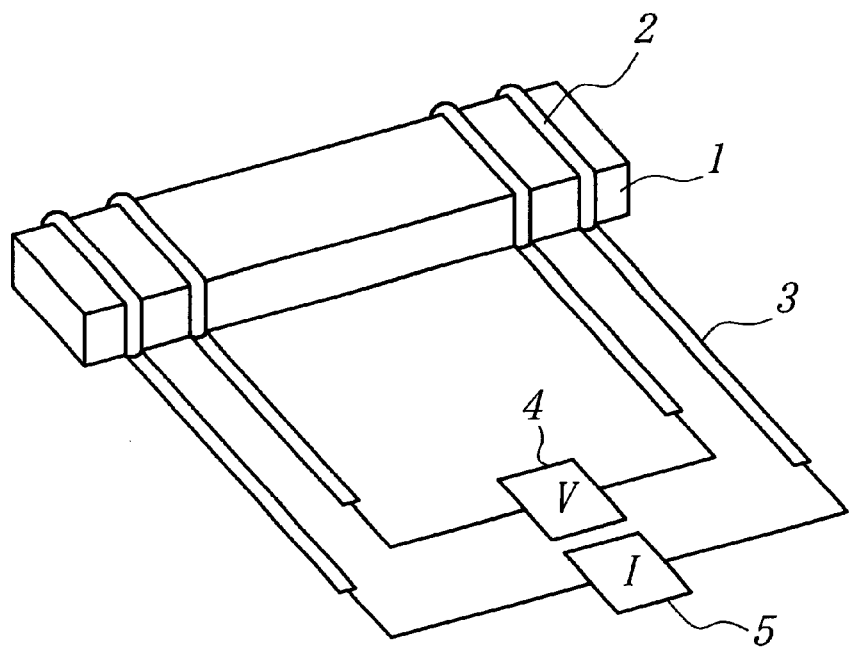
FIG. 1 is a schematic view illustrating a device for measuring the electrical resistivity of the silicon carbide.

In the following, the present invention will be explained in more detail.

A factor which increases the electrical resistance of the silicon carbide body is beyond expectation, and its mechanism cannot be explained at present and is considered novel.

Silicon carbide itself has several crystalline phases. In general, a 6H phase is a high temperature phase of silicon carbide. However, according to a literature (Hiromoto MATSUWATASHI et al., "SiC semiconductor materials, devices and conductor materials" in Material, vol. 33, No. 6, pp 720–724, 1994), changes in electrical resistivity depending upon among different crystalline phases are about 2 times at the maximum when calculated based on carrier mobility of each crystalline phase. On the other hand, the electrical resistivity of the silicon carbide body obtained by the chemical vapor deposition remarkably increases according to the present invention, which cannot be explained based on the changes in the crystalline phases.

The electrical resistivity of the silicon carbide remarkably changed when thermally treated near a thermal treatment temperature of around 2,000° C. The thermal treatment temperature is preferably not less than 2,100° C, and more preferably not less than 2,200° C. Although no particular upper limitation is posed upon the thermal treatment temperature so long as the temperature and time period do not sublimate the silicon carbide body, the upper thermal treatment temperature limit is generally not more 2,400° C.

The atmosphere in the thermal treatment is vacuum or an inert gas atmosphere, and vacuum or an argon atmosphere is particularly preferable. Nitrogen may act as a donor.

No limitation is particularly posed upon a time period for which the silicon carbide is held at the maximum temperature during the thermal treatment. However, this holding time period is preferably not less than 1 hour, more preferably not less than 2 hours. Although no limitation is particularly posed upon the thermal treatment time so long as the silicon carbide body is sublimated, not more than 48 hours is preferred from the economical standpoint of view.

The chemically vapor deposition condition employed for the formation of the silicon carbide mass is not particularly limited, but the ordinary CVD condition may be used in the present invention.

No limitation is particularly posed upon a substrate on which the silicon carbide is to be formed, but the following are preferred.

(1) A sintered body composed mainly of silicon carbide. For example, a sintered body having a compounding rate of silicon carbide of not less than 90 wt % with a relative density of not less than 90%, a porous sintered body having a compounding rate of silicon carbide of 90 wt % with a relative density of not less than 56 to 90%, and a composite sintered body of silicon carbide and metallic silicon.

(2) Insulating ceramics such as silicon nitride and aluminum nitride.

(3) Graphite

Preferably, the silicon carbide body as not thermally treated is a completely dense body having the theoretical density at a high purity, and preferably a purity of not less than 99.999% or more.

The condition for the chemical vapor deposition is preferably as follows.

Preferably, after hydrogen is continuously flown for a while through a furnace at the film-forming temperature, a silicon source compound and a carbon source compound are introduced into the furnace where a silicon carbide body is formed. By flowing hydrogen through the furnace before introducing the silicon source compound and the carbon source compound into the furnace, adhesion between the substrate and the silicon carbide body is improved to prevent peeling the silicon carbide from the substrate. It is more preferable that adhesion between the substrate and the silicon carbide body can be further improved by introducing only the silicon source material into the furnace together with hydrogen and argon for a short time period before the introduction of the carbon source compound thereinto.

As raw gases are preferably used a mixed gas composed of a silicon source compound composed of one or more kinds of $SiCl_4$, $SiHCl_3$, $SiCCl_2H_2$ and $SiH_4$, one or more kinds of $CH_4$, $C_2H_6$ and $C_3H_8$, hydrogen and argon.

At that time, the following relationship is preferably met with respect to the raw gases.

$$0.14 \leq ([A]+[B] \times n)/([Ar]+[H_2]) \leq 0.55$$

$$1.0 \leq [A]/([B] \times n) \leq 1.6$$

$$0.09 \leq [Ar]/[H_2]) \leq 5$$

in which n is the number of carbon atoms per one molecule of the carbon source material, [A] is a volume of the silicon source compound as calculated in the form of a gas in the standard state, [B] is a volume of the carbon source compound as calculated in the form of a gas in the standard state, [Ar] is a volume of argon as calculated in the standard state, and [H] is a volume of hydrogen as calculated in the standard state.

EXAMPLE

A silicon carbide mass was formed on a surface of a substrate by chemical vapor deposition. As the substrate, a discoid substrate made of graphite, 100 mm in diameter and 10 mm in thickness was used. Argon was fed as a carrier gas during when the temperature rose. Then, hydrogen was first flown for 10 minutes, then silicon tetrachloride was flown for 1 minutes, and thereafter silicon tetrachloride and methane were introduced. The flow rate of each gas at the film-forming temperature was as follows:

$$([A]+[B] \times n)/([Ar]+[H_2])=0.3$$

$$[A]/([B] \times n)=1.2$$

$$[Ar]/[H_2])=1$$

Silicon carbide bodies A, B and C were produced in this manner. Each of the silicon carbide bodies had a thickness of 3 to 5 mm. Then, with respect to each of the silicon carbide bodies A, B, and C, only the silicon carbide body was removed from the substrate, and a plurality of samples 1 as shown in FIG. 1, 4 mm wide, 2 mm thick and 40 mm long, were obtained. The samples correspond to A-1 to A-7, B-1 to B-6 and C-1 to C-6 in FIGS. 1 to 3. With respect to each sample, the electrical resistivity was measured as shown in FIG. 1. Each of the silicon carbide bodies A, B and C had electrically resistivity varied depending upon the location of the sample.

Almel wires 3 were wound at four locations of each sample 1, connected to an ampere meter 4 and a potentiometer 5, and the electrical resistivity of the silicon carbide was measured by a four-terminal method. In order to assure conduction between the sample 1 and the almel wire 3, a carbon paste 2 was applied between the almel wire and the surface of the sample 1. While a constant current was passed through outer two (current terminals) of the four almel wires, a voltage was measured between the remaining inner two (voltage terminals). The measurement was effected in room kept at 20° C. At that time, the electrical resistivity of the silicon carbide body was calculated by the following formula.

Electrical resistivity=(Sample width×thickness×voltage)/(Distance between the voltage terminals×current)

Each sample was thermally treated in vacuum or an argon atmosphere at a temperature shown in Table 1, 2 or 3. At that time, the holding time for which the sample was held at the thermal treatment temperature was changed as shown in Table 1, 2 or 3. The electrically resistivity of each sample having undergone the thermal treatment was measured, and measurement results are also shown in Tables 1 to 3. In the tables, "vacuum" means 0.3 to 0.5 Torr, and the argon atmosphere means 7N, that is, 99.99999% argon atmosphere at 1.5 atms. Table 1 to Table 3 also give the electrical resistivity at room temperature, and Table 4 that at 150° C. or 200° C.

TABLE 1

| Sample No. | Electrical resistivity before heat treatment ($\Omega \cdot$ cm) | Electrical resistivity after heat treatment ($\Omega \cdot$ cm) | | | |
|---|---|---|---|---|---|
| | | 1800° C. vacuum, 2 hrs. | 2000° C. vacuum, 2 hrs. | 2200° C. Argon, 4 hrs. | 2200° C. Argon, 24 hrs. |
| A1 | 290 | 320 | 3000 | — | — |
| A2 | 230 | — | 2800 | — | — |
| A3 | 330 | — | 3900 | — | — |
| A4 | 250 | — | — | 6000 | — |
| A5 | 390 | — | — | 6800 | — |
| A6 | 300 | — | — | — | 18000 |
| A7 | 320 | — | — | — | 28000 |

TABLE 2

| Sample No. | Electrical resistivity before heat treatment ($\Omega \cdot$ cm) | Electrical resistivity after heat treatment ($\Omega \cdot$ cm) | | | |
|---|---|---|---|---|---|
| | | 1800° C. vacuum, 2 hrs. | 2000° C. vacuum, 2 hrs. | 2200° C. Argon, 4 hrs. | 2200° C. Argon, 24 hrs. |
| B1 | 2000 | — | 6000 | — | — |
| B2 | 3200 | — | 8200 | — | — |
| B3 | 3800 | — | 8800 | — | — |
| B4 | 2500 | — | — | 9900 | 80000 |

TABLE 2-continued

| Sample No. | Electrical resistivity before heat treatment ($\Omega \cdot$ cm) | Electrical resistivity after heat treatment ($\Omega \cdot$ cm) | | | |
|---|---|---|---|---|---|
| | | 1800° C. vacuum, 2 hrs. | 2000° C. vacuum, 2 hrs. | 2200° C. Argon, 4 hrs. | 2200° C. Argon, 24 hrs. |
| B5 | 2800 | — | — | 12000 | — |
| B6 | 3500 | — | — | 18000 | — |

TABLE 3

| Sample No. | Electrical resistivity before heat treatment ($\Omega \cdot$ cm) | Electrical resistivity after heat treatment ($\Omega \cdot$ cm) | | | |
|---|---|---|---|---|---|
| | | 1800° C. vacuum, 2 hrs. | 2000° C. vacuum, 2 hrs. | 2200° C. Argon, 4 hrs. | 2200° C. Argon, 24 hrs. |
| C1 | 7100 | 7800 | — | — | — |
| C2 | 6200 | — | 13000 | — | — |
| C3 | 6500 | — | 19000 | — | 1200000 |
| C4 | 7700 | — | 22000 | — | 930000 |
| C5 | 6800 | — | — | 40000 | 1200000 |
| C6 | 7000 | — | — | 45000 | — |

TABLE 4

| Sample No. | Electrical resistivity before heat treatment ($\Omega \cdot$ cm) | Heat treatment condition | Electrical resistivity after heat treatment ($\Omega \cdot$ cm) | |
|---|---|---|---|---|
| | | | 150° C. | 200° C. |
| A1 | 290 | 1800° C. vacuum, 2 hrs. | 36 | 22 |
| A2 | 230 | 2000° C. vacuum 2 hrs. | 170 | 94 |
| A4 | 250 | 2200° C. Argon, 4 hrs. | 280 | 140 |
| A6 | 300 | 2200° C. Argon, 24 hrs. | 1800 | 800 |
| C1 | 7100 | 1800° C. vacuum, 2 hrs. | 480 | 190 |
| C2 | 6200 | 2000° C. vacuum, 2 hrs. | 720 | 410 |
| C5 | 6800 | 2200° C. Argon, 4 hrs. | 3900 | 2100 |
| C6 | 7000 | 2200° C. Argon, 4 hrs. | 4600 | 3200 |

As is seen from Table 1 to Table 4, the electrical resistivity of the silicon carbide body not remarkably increased when thermally treated at 1800° C., whereas the electrical resistivity conspicuously increased when thermally treated at 2,000° C. or more. When the thermal treatment temperature was 2,100° C., particularly 2,200° C. or more, the electrical resistivity more conspicuously increased. It is clarified that when thermally treated at 2,200° C., the electrical resistivity was further increased.

As having been explained, according to the present invention, the electrical resistivity of the silicon carbide body obtained by the chemical vapor deposition can be remarkably increased.

What is claimed is:

1. A method for producing a silicon carbide body, comprising the steps of forming a silicon carbide mass by chemical vapor deposition, and thermally treating the silicon carbide mass under vacuum or in an inert gas atmosphere at a temperature not less than 2000° C., said silicon carbide body having an electric resistivity higher than that of the silicon carbide mass having not been thermally treated.

2. The producing method set forth in claim 1, wherein the thermal treatment temperature is not less than 2,100° C.

3. The producing method set forth in claim 1, wherein the thermal treatment temperature is not less than 2,200° C.

4. The producing method set forth in claim 1, wherein a time period during which the silicon carbide mass is held at the thermal treatment is not less than 1 hour to a length not causing the silicon carbide body to be sublimated.

5. The producing method set forth in claim 1, wherein the silicon carbide mass is formed on a substrate by chemical vapor deposition.

6. The producing method set forth in claim 5, wherein the substrate is made of a material selected from a sintered body composed mainly of silicon carbide, a porous sintered body composed mainly of silicon carbide or a composite sintered body of silicon carbide and metallic silicon, or an insulating ceramic material or graphite.

7. The producing method set forth in claim 6, wherein the substrate is made of a material selected from a sintered body having a compounding rate of silicon carbide of not less than 90 wt % with a relative density of not less than 90%, a porous sintered body having a compounding rate of silicon carbide of 90 wt % with a relative density of not less than 56 to 90%, silicon nitride or aluminum nitride.

8. The producing process set forth in claim 1, wherein the chemical vapor deposition uses, as raw gases, a mixed gas composed of a silicon source compound composed of at least one of $SiCl_4$, $SiHCl_3$, $SiCCl_2H_2$ and $SiH_4$, one or more kinds of $CH_4$, $C_2H_6$ and $C_3H_8$, hydrogen and argon.

9. A method for producing a silicon carbide body, comprising the steps of:

forming a silicon carbide mass by chemical vapor deposition, wherein the chemical vapor deposition uses, as raw gases, a mixed gas composed of a silicon source compound composed of at least one of $SiCl_4$, $SiHCl_3$, $SiCCl_2H_2$ and $SiH_4$, one or more kinds of $CH_4$, $C_2H_6$ and $C_3H_8$, hydrogen and argon, and wherein the mixed gas satisfies:

$0.14 \leq ([A]+[B] \times n)/[Ar]+[H_2]) \leq 0.55$ $1.0 \leq [A]/([B] \times n) \leq 1.6$ $0.09 \leq ([Ar]/[H_2]) \leq 5$ in which n is the number of carbon atoms per one molecule of the carbon source material, [A] is a volume of the silicon source compound as calculated in the form of a gas in the standard state, [B] is a volume of the carbon source compound as calculated in the form of a gas in the standard state, [Ar] is a volume of argon as calculated in the standard state, and [H] is a volume of hydrogen as calculated in the standard state; and thermally treating the silicon carbide mass under vacuum or in an inert gas atmosphere at a temperature not less than 2000° C.;

wherein said silicon carbide body has an electric resistivity higher than that of the silicon carbide mass before being thermally treated.

10. The producing method set forth in claim 2, wherein a time period during which the silicon carbide mass is held at the thermal treatment is not less than 1 hour to a length not causing the silicon carbide body to be sublimated.

11. The producing method set forth in claim 3, wherein a time period during which the silicon carbide mass is held at the thermal treatment is not less than 1 hour to a length not causing the silicon carbide body to be sublimated.

12. The producing method set forth in claim 2, wherein the silicon carbide mass is formed on a substrate by chemical vapor deposition.

13. The producing method set forth in claim 12, wherein the substrate is made of a material selected from a sintered body composed mainly of silicon carbide, a porous sintered body composed mainly of silicon carbide or a composite sintered body of silicon carbide and metallic silicon, or an insulating ceramic material or graphite.

14. The producing method set forth in claim 13, wherein the substrate is made of a material selected from a sintered body having a compounding rate of silicon carbide of not less than 90 wt % with a relative density of not less than 90%, a porous sintered body having a compounding rate of silicon carbide of 90 wt % with a relative density of not less than 56 to 90%, silicon nitride or aluminum nitride.

15. The producing method set forth in claim 3, wherein the silicon carbide mass is formed on a substrate by chemical vapor deposition.

16. The producing method set forth in claim 15, wherein the substrate is made of a material selected from a sintered body composed mainly of silicon carbide, a porous sintered body composed mainly of silicon carbide or a composite sintered body of silicon carbide and metallic silicon, or an insulating ceramic material or graphite.

17. The producing method set forth in claim 16, wherein the substrate is made of a material selected from a sintered body having a compounding rate of silicon carbide of not less than 90 wt % with a relative density of not less than 90%, a porous sintered body having a compounding rate of silicon carbide of 90 wt % with a relative density of not less than 56 to 90%, silicon nitride or aluminum nitride.

18. The producing process set forth in claim 2, wherein the chemical vapor deposition uses, as raw gases, a mixed gas composed of a silicon source compound composed of at least one of $SiCl_4$, $SiHCl_3$, $SiCCl_2H_2$ and $SiH_4$, one or more kinds of $CH_4$, $C_2H_6$ and $C_3H_8$, hydrogen and argon.

19. The producing process set forth in claim 3, wherein the chemical vapor deposition uses, as raw gases, a mixed gas composed of a silicon source compound composed of at least one of $SiCl_4$, $SiHCl_3$, $SiCCl_2H_2$ and $SiH_4$, one or more kinds of $CH_4$, $C_2H_6$ and $C_3H_8$ , hydrogen and argon.

* * * * *